(12) United States Patent
Trompenaars

(10) Patent No.: US 9,360,114 B2
(45) Date of Patent: Jun. 7, 2016

(54) COATED O-RING

(71) Applicant: FEI Company, Hillsboro, OR (US)

(72) Inventor: Petrus Hubertus Franciscus Trompenaars, Tilburg (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 14/057,283

(22) Filed: Oct. 18, 2013

(65) Prior Publication Data

US 2014/0110903 A1    Apr. 24, 2014

Related U.S. Application Data

(60) Provisional application No. 61/715,928, filed on Oct. 19, 2012.

(30) Foreign Application Priority Data

Oct. 19, 2012    (EP) ..................................... 12189255

(51) Int. Cl.
*F16J 15/02*    (2006.01)
*F16J 15/06*    (2006.01)
*F16J 15/32*    (2016.01)
(Continued)

(52) U.S. Cl.
CPC ................. *F16J 15/06* (2013.01); *C23C 16/40* (2013.01); *C23C 16/45555* (2013.01); *F16J 15/32* (2013.01)

(58) Field of Classification Search
CPC ..... F16J 15/32; F16J 15/3208; F16J 15/3248; F16J 15/3252; F16J 15/06; C23C 16/40; C23C 16/45555

USPC .................. 277/314, 910, 628, 630, 650, 654
See application file for complete search history.

(56) References Cited

U.S. PATENT DOCUMENTS

| 2,967,805 A * | 1/1961 | Forestek ......................... 205/73 |
| 6,942,222 B2 * | 9/2005 | Fink .............................. 277/608 |
| 7,464,968 B2 * | 12/2008 | Sakazaki et al. .............. 285/242 |

(Continued)

FOREIGN PATENT DOCUMENTS

JP    2005-060802    10/2005

OTHER PUBLICATIONS

Unknown, "FEP- or PFA-Encapsulated O-Rings," http://www.dichtungen-o-ringe.de/o-rings-and-seals/fep-or-pfa-encapsulapsulated-o-rings.html?L=2, accessed on Oct. 9, 2013.

(Continued)

*Primary Examiner* — Kristina Fulton
*Assistant Examiner* — Nathan Cumar
(74) *Attorney, Agent, or Firm* — John B. Kelly; Scheinberg & Associates

(57) ABSTRACT

The invention relates to a coated O-ring for forming a seal, in which the core of the O-ring comprises a polymer and/or synthetic rubber, and the coating comprises an inorganic coating with a thickness between 10 nm and 1 μm, resulting in an O-ring that shows a lower permeation than an uncoated O-ring and where the coating shows little or no cracking when the local curvature of the O-ring in any direction is changed by 20%.
The coating is preferably applied by Atomic Layer Deposition, but also other deposition techniques such as (PE)CVD, E-beam evaporation, and reactive evaporation may be used.
A further elastomer layer may cover the one or more coating layers for further mechanical and/or chemical protection.

15 Claims, 1 Drawing Sheet

Figure 1:
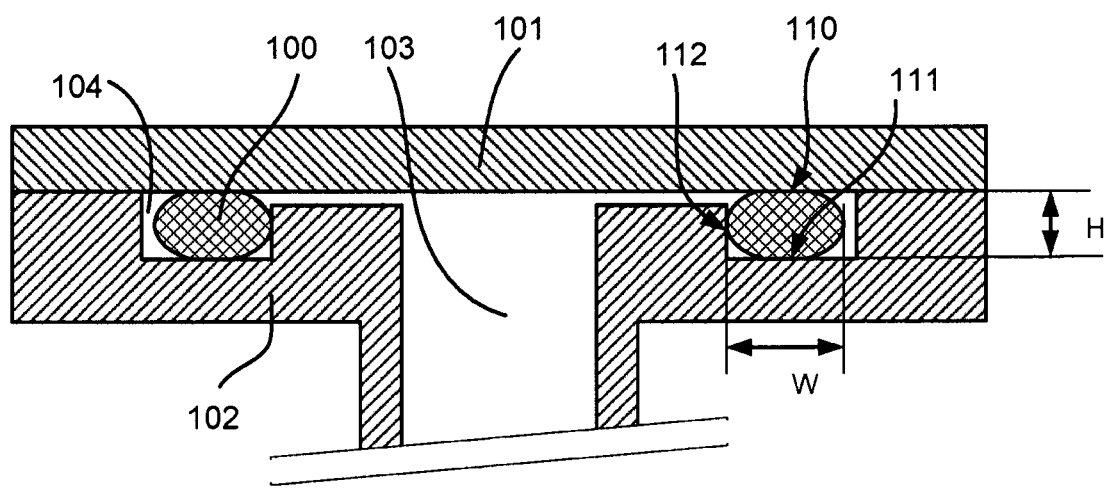

(51) Int. Cl.
*C23C 16/40* (2006.01)
*C23C 16/455* (2006.01)

(56) References Cited

U.S. PATENT DOCUMENTS

| | | | |
|---|---|---|---|
| 7,518,121 B2 | 4/2009 | Maas et al. | |
| 2004/0157035 A1* | 8/2004 | Guizzetti et al. | 428/66.6 |
| 2007/0098978 A1 | 5/2007 | Tanaka et al. | |
| 2009/0311577 A1* | 12/2009 | Washima et al. | 429/34 |
| 2009/0322040 A1* | 12/2009 | Banba et al. | 277/654 |
| 2011/0057393 A1 | 3/2011 | van den Boom et al. | |
| 2012/0326391 A1* | 12/2012 | Hirose et al. | 277/312 |

OTHER PUBLICATIONS

Danielson, Phil, "Gas Loads and O-Rings," A Journal of Practical and Useful Vacuum Technology, http://www.vacuumlab.com/Articles/Gas%20Loads%20and%20O-rings.pdf, 2004, pp. 4.

Groner, M.D., et al., "Gas diffusion barriers on polymers using Al2O3 atomic layer deposition," Applied Physics Letters, 2006, pp. 3, vol. 88.

Sturm, P., et al., "Permeation of atmospheric gases through polymer O-rings used in flasks for air sampling," Journal of Geophysical Research, 2004, 9 pages, vol. 109.

Danielson, Phil, "Gas Loads and O-Rings," A Journal of Practical and Useful Vacuum Technology, www.vacuumlab.com, 2000.

Groner, M. D., et al., "Gas diffusion barriers on polymers using Al2O3 atomic layer deposition," American Institute of Physics, 2006, vol. 88, pp. 051907-1 to 051907-3.

Sturm, P., et al., "Permeation of atmospheric gases through polymer O-rings used in flasks for air sampling," Journal of Geophysical Research, 2004, vol. 109, 9 pages.

Unknown, "FEP- or PFA-Encapsulated O-Rings," http://www.dichtungen-o-ringe.de/o-rings-and-seals/fep-or-pfa-encapsulated-o-rings.html?L=2, last accessed Oct. 9, 2013, 2 pages.

* cited by examiner

COATED O-RING

This Application claims priority from U.S. Provisional Application 61/715,928, filed Oct. 19, 2012, which is hereby incorporated by reference.

The invention relates to a coated O-ring for forming a seal, the core of the O-ring comprising a polymer and/or synthetic rubber.

Coated O-rings, also known as encapsulated O-rings, are well known, for example Fluoroelastomer O-rings with a FEP or PFA coating. The coating is used to enhance a property of the O-ring, such as its chemical resistance or its mechanical behavior (the coating may, for example, have a lubricating effect). See, for example, the internet publication "FEP- or PFA-Encapsulated O-rings" by KED seals [—1—].

O-rings are use to form a seal between a high-pressure environment and a low-pressure environment. The O-ring can thus divide, for example, atmosphere from the inside of a pressurized bottle with e.g. steam liquid propane/butane at room temperature, or it can form the division between atmosphere and vacuum. Especially in the latter application the diffusion of gases and vapors through the O-ring can determine the final pressures of the vacuum, see e.g. the internet publication "A journal of practical and useful vacuum technology" by Phil Danielson [—2—].

It is noted that the phrase 'permeation' and 'diffusion' are used as synonyms to describe the transport of a gas or fluid through an O-ring.

When using fluoroelastomer O-rings (such as Viton® O-rings) at a vacuum pressure of $10^{-5}$ mbar or below, often the diffusion of water through the O-ring is a severely limiting factor. This can further be aggravated when the vacuum comprises parts at a cryogenic temperature where said water freezes onto. An example of such a vacuum with enclosed cryogenic parts occurs in a cryo-electron microscope, such as the 'Tecnai G2 Polara' or the 'Titan Krios', manufactured by FEI Company, Hillsboro, USA, in which biological samples can be inspected at cryogenic temperature.

It is noted that different materials, for example PFA and a fluoroelastomer, typically have different selectivity for different gases, that is: when a fluid shows in the first material a diffusion that is in the order of the permeation in the second material, this need not be true for other gases. See also "Permeation of atmospheric gases through polymer O-rings used in flasks for air sampling" by P. Sturm et al [—3—], more specifically its table 1. This table shows, for example, that a Viton O-ring shows a $H_2O/O_2$ selectivity of approximately $40/1 \approx 40$ while PTFE shows a selectivity of approximately $27/0.04 = 675$, this using the same reference (Peacock).

A drawback of the known coated O-rings is that the coating does not diminish the diffusion compared to the best uncoated O-rings, such as fluoroelastomer O-rings, There is a need for O-rings with a lower permeation, more specifically a lower permeation for water.

The invention intends to provide an O-ring with a lower permeation than the known O-rings, more specific better than (uncoated) fluoroelastomer O-rings.

To that end the coated O-ring according to the invention is characterized in that the coating is a thin anorganic coating with a thickness between 10 nm and 1 µm, more specifically between 20 nm and 100 nm, most specifically between 20 nm and 50 nm, resulting in an O-ring that shows a lower permeation than an uncoated O-ring and where the coating shows little or no cracking when the local curvature of the O-ring in any direction is changed by 20%.

The use of inorganic coating as a gas barrier on a polymer film is already known from e.g. "Gas diffusion barriers on polymers using Al2O3 atomic layer deposition", M. D. Groner et al., Applied Physics Letters 88, 051907 (2006) [—4—].

Here a $Al_2O_3$ layer was deposited on polyethylene naphthalate (PEN) and Kapton® polyimide substrates and the oxygen and water transmission rates were determined. Experiments showed a decrease of the water vapor transmission coefficient with approximately three orders of magnitude (1000×). The thickness of the deposited layer to achieve this decrease was approximately 15 nm.

The invention is based on the insight that the use of such a layer on the elastomer of an O-ring would result in an O-ring with a much reduced water vapor diffusion. Inventors found that applying the layer with, for example, Atomic Layer Deposition (ALD) resulted in a coating that shows good adherence to the elastomer, as a result of which the layer can follow the deformations that occur when an O-ring is exposed to normal deformations (change of curvature of 20%).

First results showed for a Viton® O-ring a marked improvement in diffusion for water without change in elasticity. The coating adhered sufficiently to the elastomer to enable use as a dynamic O-ring. Therefore the O-ring can be used in all applications (grooves) where an uncoated o-ring of the same core material can be used.

In an embodiment the anorganic coating comprises metal oxides, more specifically a metal oxide from the group of $SiO_2$, $Al_2O_3$, and TiO.

Experiments with metal oxides such as $SiO_2$, $Al_2O_3$, and TiO gave good results in relation to adherence of the layer to the core and in relation to diffusion.

In a further embodiment the coating comprises two layers, a layer of $Al_2O_3$ at the elastomer and a layer of $SiO_2$ at the outside.

Inventors found that an $Al_2O_3$ layer alone is slightly corroded by water vapor. By covering the $Al_2O_3$ layer with a $SiO_2$ layer, the $SiO_2$ layer protects the $Al_2O_3$ layer from corrosion, and also plugs holes (pin point defects) in the $Al_2O_3$ layer.

In a preferred embodiment the polymer or synthetic rubber comprises fluoroelastomere, perfluoroelastomer, nitrile rubber, fluorosilicone, or urethane.

By use of these well-known elastomeres, a coated O-ring with known mechanical (elasticity) and thermal (maximum and minimum temperature range) properties can be formed.

In yet another embodiment the anorganic coating is coated with a protective polymer film with a thickness between 100 nm and 10 µm, more preferably between 100 nm and 2.5 µm, said polymer film acting as a chemical and/or mechanical protective layer for the anorganic film.

Inventor found that a layer of a polymer film acts as a mechanical and chemical protective layer. Experiments showed that a thickness between 100 nm and 2.5 µm gave a layer that offers good mechanical and chemical resistance. However, for a more robust O-ring (robust in relation to e.g. mechanical punctures of the coating), thicker coatings up to 10 µm can be used.

In a preferred embodiment the O-ring is, prior to coating, baked.

During the manufacturing of, for example, fluoroelastomers, water is formed inside the fluoroelastomer, see e.g. Phil Danielson [—2—], chapter "Virgin O-rings". It is therefore advised to bake-out such O-rings before use, more specifically to bake-out such O-rings in vacuum. When coating the O-rings with a coating that lowers the water permeation, such water would otherwise be build into (trapped into) the core of the O-ring. Therefore it is advised to bake the O-ring (in vacuum) before coating, so that the core contains less water.

For a good adherence of the coating to the core a process from the group of (PE)CVD, E-beam evaporation, reactive evaporation, atomic layer deposition (ALD) is selected. Tests performed on coatings for a fluoroelastomer applied with ALD gave good results, that is: the coating shows good adherence when the O-ring was deformed to a deformation that resulted in a change of local curvature was 20%, corresponding to a change in width W and core diameter D such that $(W/D-1) \leq 0.2$ (equivalent to 20%), which is seen as a 'normal' deformation for an O-ring.

The invention is now elucidated using figures, in which identical numerals refer to corresponding features.

Figure 2:
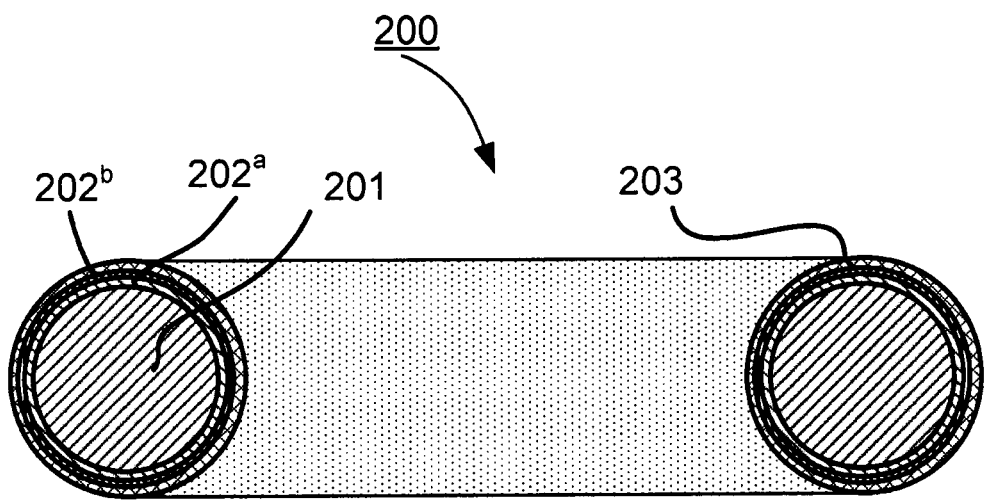

To that end:

FIG. 1 schematically shows a cross-section of an O-ring in a grove;

FIG. 2 schematically shows a cross-section of a coated O-ring.

FIG. 1 schematically shows a cross-section of an O-ring 100 in a grove.

O-ring 100 is clamped between flanges 101 and 102. As a result the O-ring is flattened and two sealing faces 110 and 111 are formed. When volume 103 is now evacuated by pumping means (not shown), a pressure difference between volume 104 (typically connected to atmosphere) and volume 103 occurs. Permeation through the O-ring will then occur. It is noted that also a seal at face 112 often occurs.

The faces at the flanges, where a seal occurs, should be completely scratch free. Therefore these are often recessed. Compression, i.e. the ratio (W/H)−1, should be a maximum of 30% for O-ring thicknesses (cross sections) of less than 3 mm, and 20-15% for thicknesses of 5-10 mm.

FIG. 2 schematically shows a cross-section of a coated O-ring 200 according to the invention.

A core 201 of an elastomer, the core resembling a state of the art O-ring, is covered with a thin layer $202^a$ of, for example, $Al_2O_3$. To plug holes that are left over during application of the layer (using for example ALD), this layer of $Al_2O_3$ is preferably covered with another layer $202^b$ of, for example, $SiO_2$. This layer also protects the $Al_2O_3$ layer for corrosion. A further protective layer 203 of an elastomer adds further chemical and/or mechanical protection.

Typical sizes for all the elements are (although other thicknesses may be used):
 core O-ring (201): 1 mm or more,
 $Al_2O_3$ layer ($202^a$): between 20-50 nm,
 $SiO_2$ layer ($202^b$): between 20-50 nm,
 Elastomer (203): appr. 1 µm Literature

[—1—] "FEP- or PFA-Encapsulated O-rings", KED seals, http://www.dichtungen-O-ringe.de/O-rings-an-seals/fep-or-pfa-encapsulated-O-rings.html?L=2

[—2—] "A journal of practical and useful vacuum technology", Phil Danielson, http://www.vacuumlab.com/Articles/Gas%20Loads%20and%20O-rings.pdf

[—3—] "Permeation of atmospheric gases through polymer O-rings used in flasks for air sampling", P. Sturm et al., Journal of geophysical research, Vol. 109, D04309, doi: 10.1029/2003JD004073, 2004. ftp://ftp.bgc.mpg.de/pub/outgoing/athuille/Publications/2004/Sturm_JoGR_2004.pdf

[—4—] "Gas diffusion barriers on polymers using Al2O3 atomic layer deposition", M. D. Groner et al., Applied Physics Letters 88, 051907 (2006).

The invention claimed is:

1. A coated O-ring for forming a seal, the core of the O-ring comprising a polymer and/or synthetic rubber, characterized in that the coating comprises an anorganic coating with a thickness between 10 nm and 1 µm, resulting in an O-ring that shows a lower permeation than an uncoated O-ring and where the coating shows substantially no cracking when the local curvature of the O-ring in any direction is changed by 20%, in which the coating is a coating comprising a metal oxide, selected from the group of $SiO_2$, $Al_2O_3$, and TiO.

2. The O-ring of claim 1 in which the coating comprises two layers, a layer of $Al_2O_3$ in contact with the core of the O-ring and a layer of $SiO_2$ surrounding the layer of $Al_2O_3$.

3. The O-ring of claim 1 in which the core of the O-ring comprises fluoroelastomere, perfluoroelastomer, nitrile rubber, fluorosilicone, or urethane.

4. The O-ring of claim 1 in which the anorganic coating is coated with a protective polymer film with a thickness between 100 nm and 10 µm, said polymer film acting as a chemical and/or mechanical protective layer for the anorganic film.

5. The O-ring of claim 1 in which the O-ring, prior to coating, is de-gassed by a bake-out.

6. The O-ring of claim 1, in which the coating is applied by (PE)CVD, E-beam evaporation, reactive evaporation, atomic layer deposition.

7. The O-ring of claim 1 in which the O-ring shows a permeation for water that is at least ten times lower than for an uncoated O-ring.

8. The O-ring of claim 1 in which the thickness of the inorganic coating is between 20 nm and 100 nm.

9. The O-ring of claim 4 in which the thickness of the protective polymer film is between 100 nm and 2.5 µm.

10. The O-ring of claim 5 in which the bake-out is a vacuum bake-out.

11. A method of sealing an evacuated volume from atmosphere, comprising:
 providing two flanges, at least one of the flanges having a groove;
 providing an o-ring in accordance with claim 1; and
 compressing the o-ring between the two flanges.

12. The method of claim 11 in which the anorganic coating is coated with a protective polymer film with a thickness between 100 nm and 10 µm, said polymer film acting as a chemical and/or mechanical protective layer for the anorganic film.

13. A vacuum seal comprising:
 a first flange and a second flange, at least one of the first flange and the second flange including a groove; and
 an o-ring in accordance with claim 1 positioned in the groove.

14. The vacuum seal of claim 13 in which the o-ring is compressed to between 20% and 30% of the o-ring thickness between the flanges.

15. The vacuum seal of claim 13 in which the anorganic coating is coated with a protective polymer film with a thickness between 100 nm and 10 µm, said polymer film acting as a chemical and/or mechanical protective layer for the anorganic film.

* * * * *